(12) United States Patent
Carswell

(10) Patent No.: US 12,347,713 B2
(45) Date of Patent: Jul. 1, 2025

(54) SEMICONDUCTOR APPARATUS WITH AN ALIGNMENT MOAT

(71) Applicant: Micron Technology, Inc., Boise, ID (US)

(72) Inventor: Andrew D. Carswell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 439 days.

(21) Appl. No.: 17/747,446

(22) Filed: May 18, 2022

(65) Prior Publication Data

US 2023/0377928 A1 Nov. 23, 2023

(51) Int. Cl.
| | | |
|---|---|---|
| H01L 21/68 | (2006.01) | |
| H01L 21/48 | (2006.01) | |
| H01L 23/00 | (2006.01) | |
| H10D 84/01 | (2025.01) | |
| H10D 84/03 | (2025.01) | |
| H01L 23/498 | (2006.01) | |

(52) U.S. Cl.
CPC ............ *H01L 21/68* (2013.01); *H01L 21/486* (2013.01); *H01L 24/04* (2013.01); *H01L 24/65* (2013.01); *H10D 84/0147* (2025.01); *H10D 84/038* (2025.01); *H01L 23/49827* (2013.01); *H01L 2224/83894* (2013.01); *H01L 2225/06562* (2013.01)

(58) Field of Classification Search
CPC ......... H01L 24/64; H01L 24/65; H01L 24/66; H01L 24/67; H01L 24/03; H01L 24/04; H01L 24/05; H01L 24/06; H01L 24/02; H01L 24/01; H01L 21/486; H01L 23/49827; H01L 2225/06562; H01L 2225/0654; H01L 21/682; H01L 21/68; H01L 2223/54426; H01L 2225/06593; H01L 25/0657; H01L 25/0756; H01L 25/043; H01L 25/074; H01L 25/06562; H01L 2224/81894; H01L 2224/81895; H01L 2224/81896; H01L 2224/83894–83896; H01L 2224/80894–80896

See application file for complete search history.

(56) References Cited

U.S. PATENT DOCUMENTS

| | | |
|---|---|---|
| 7,385,283 B2 | 6/2008 | Wu et al. |
| 2008/0233710 A1 | 9/2008 | Hsu et al. |
| 2012/0193752 A1 | 8/2012 | Purushothaman et al. |
| 2012/0273940 A1 | 11/2012 | Jo |
| 2013/0273691 A1 | 10/2013 | Pascual et al. |

(Continued)

*Primary Examiner* — Peniel M Gumedzoe
*Assistant Examiner* — Douglas Yap
(74) *Attorney, Agent, or Firm* — Brooks, Cameron & Huebsch, PLLC

(57) ABSTRACT

Methods, apparatuses, and systems related to an apparatus with an alignment moat are described. An example apparatus includes a conductive material divided into first and second portions which include top surfaces connected to each other, respectively, a first spacer surrounding the first portion of the conductive material, and a second spacer surrounding the second portion of the conductive material, where the top surface of the first spacer and the top surface of the second spacer are indented from the top surface of the first portion and the top surface of the second portion, respectively, to define an alignment moat.

17 Claims, 5 Drawing Sheets

(56) References Cited

U.S. PATENT DOCUMENTS

| | | | |
|---|---|---|---|
| 2014/0273347 A1 | 9/2014 | Tseng et al. | |
| 2016/0155862 A1* | 6/2016 | Hong | H01L 24/32 |
| | | | 257/432 |
| 2021/0066224 A1* | 3/2021 | Jang | H01L 27/14627 |
| 2021/0217716 A1* | 7/2021 | Wu | H10B 41/40 |
| 2021/0320075 A1* | 10/2021 | Hou | H01L 24/05 |
| 2021/0327838 A1* | 10/2021 | Hou | H01L 24/03 |
| 2022/0077105 A1* | 3/2022 | He | H01L 24/80 |
| 2022/0216167 A1* | 7/2022 | Yang | H01L 24/80 |
| 2023/0008286 A1* | 1/2023 | Hou | H01L 25/50 |

\* cited by examiner

SEMICONDUCTOR APPARATUS WITH AN ALIGNMENT MOAT

TECHNICAL FIELD

The disclosure relates generally to semiconductor devices and methods, and more particularly to a semiconductor apparatus with an alignment moat.

Semiconductor devices can be used in a variety of electronic applications, such as personal computers, cell phones, digital cameras, and other electronic devices. Various semiconductor devices (e.g., memory dies) utilize through-substrate-vias (TSVs) which are conductive vias that can provide electrical continuity through a semiconductor device, such as a silicon wafer or die, for instance. TSVs can enable two or more semiconductor devices (e.g., integrated circuit (IC) devices) to be stacked vertically into a three-dimensional (3D) chip/wafer stack. For example, the TSVs of an IC device at a top of a stack can connect to the TSVs of an IC device lower in the stack. By electrically connecting the IC devices in a stack, the TSVs can enable the IC devices in the stack to function as a single device. TSV technology can enable a 3D chip stack to have increased connectivity, bandwidth, and/or functionality, yet occupy a small footprint area, among other benefits.

DETAILED DESCRIPTION

Figure 1:
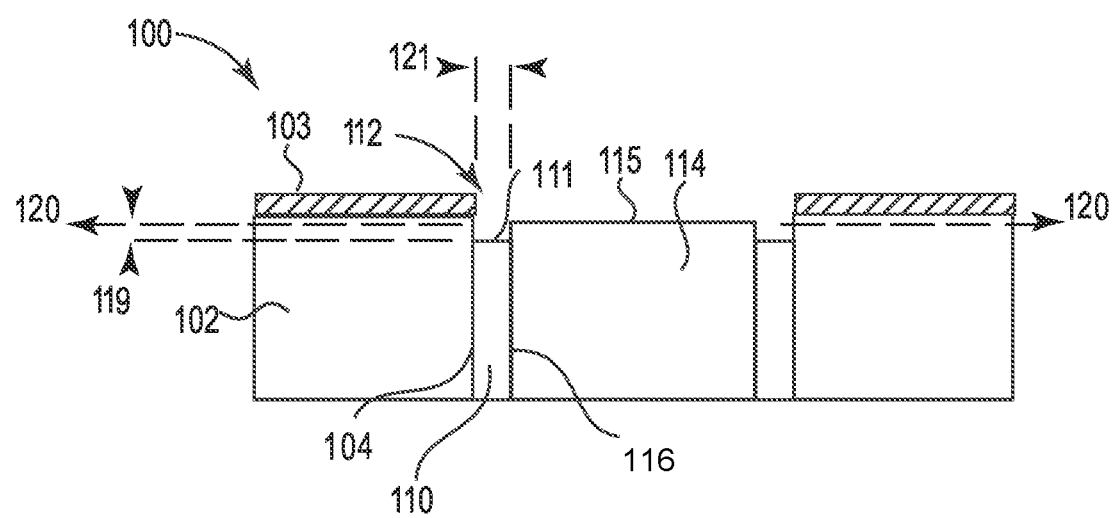
FIG. 1 illustrates a view of a cross-section of an example of a semiconductor device with an indentation in accordance with a number of embodiments of the disclosure.

Semiconductor devices formed on and/or in the substrate can include access devices such as transistors and storage nodes such as capacitors in an example memory array. A dynamic random access memory (DRAM) array is one form of an example memory array that can be formed from semiconductor devices, as discussed herein. The memory array may have an array of access devices and storage nodes forming memory cells at the intersection of rows and columns. An access line (e.g., word line (WL)), may be used to activate an access device (e.g., a transistor), to access (e.g., turn "on" or "off" access to) the storage node of a memory cell. A sense line (e.g., bit line (BL) or digit line (DL)) may be used to read and/or program, e.g., write, refresh, erase, etc. to and/or from a storage node of the memory cells.

Wafer and/or chip bonding can be used to form vertical stacks of semiconductor devices without utilizing intervening structures such as substrates, soldered connections, and/or circuit boards, for instance. The presence of these intervening structures may not be desired/possible as design rules scale to smaller dimensions.

Thus, direct wafer and/or chip bonding can effectively and efficiently be utilized to form a single packaged semiconductor system, which includes two or more wafer and/or chip layers. For instance, a first conductive material in a first semiconductor device (e.g., a wafer or chip) can be bonded (directly and in the absence of intervening structures) to a second conductive material in a second semiconductor device (e.g., a wafer or chip). The first conductive material can be bonded to the second conductive material by subjecting the first conductive material and/or the second conductive material to heat treatment at an elevated temperature. Such heat treatment can cause the first conductive material and/or the second conductive material to expand and thereby form a bond (e.g., a metal to metal bond) between the first conductive material and the second conductive material.

Connecting 3D chip/die stacks in a manner to provide adequate power and adequate wear longevity poses challenges. For instance, direct wafer and/or chip bonding is predicated on proper alignment of semiconductor devices that are to be directly bonded. For instance, the first conductive material can be aligned with the second conductive material at an interface between the semiconductor devices. Yet, proper alignment of the semiconductor devices can be difficult, particularly as design rules scale to smaller dimensions. Improper alignment of the semiconductor devices may result in incomplete bond formation. For instance, any misalignment between the first conductive material and the second conductive material may result in the formation of voids (e.g., air spaces) between the first conductive material and the second conductive material.

Improper alignment of the semiconductor devices can result in a force (e.g., normal to an interface between the semiconductor devices) that is generated during the heat treatment. For example, a normal force can be generated between the first conductive material and/or second conductive material and a different material (e.g., a dielectric material) at the interface between the semiconductor devices. This normal force can inhibit expansion of the first conductive material and/or the second conductive material and thus hinder or prohibit the formation of a complete bond (e.g., without voids between the first conductive material and the second conductive material). In any case, incomplete bond formation may contribute to unintended consequences related to the electrical properties of a semiconductor device (e.g., memory device), which may adversely affect performance related to data access, storage, and/or processing functions of the semiconductor device, for instance.

The disclosure includes methods, apparatuses, and systems related to semiconductor devices suitable for an apparatus with an alignment moat. An example of an apparatus with an alignment moat includes a conductive material divided into first and second portions which include top surfaces connected to each other, respectively, a first spacer surrounding the first portion of the conductive material, and a second spacer surrounding the second portion of the conductive material, where the top surface of the first spacer and the top surface of the second spacer are indented from the top surface of the first portion and the top surface of the second portion, respectively, to define an alignment moat.

A top surface of a spacer such as the first spacer and/or the second spacer can be recessed a distance below a plane extending along the top surface (e.g., a top surface) of the dielectric material and thereby can define at least a portion of an indentation. That is, an indentation can be located between a portion of the side surface of the dielectric material and a portion of the side surface of the conductive material. The indention can permit formation of an apparatus with an alignment moat and thereby mitigate and/or eliminate the formation of voids at an interface during heat treatment, and thus promote complete bond formation between the first conductive material in the first semiconductor device and the second conductive material in the second semiconductor device. Stated differently, the presence of the alignment moat in the apparatus can reduce the presence of any voids at an interface between the bonded semiconductor devices, as compared to other approaches that do not employ an alignment moat.

In the following detailed description of the disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the disclosure. As used herein, "a number of" something can refer to one or more such things. For example, a number of capacitors can refer to at least one capacitor.

Relative terms such as "under," "below," "underneath," "over," "on," "above," "bottom," "side," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the disclosure can be positioned in a number of different orientations (e.g., rotated 90 degrees, 180 degrees, or at another orientations), the relative terms should be interpreted accordingly.

The figures herein follow a numbering convention in which the first digit or digits correspond to the figure number of the drawing and the remaining digits identify an element or component in the drawing. Similar elements or components between different figures may be identified by the use of similar digits. For example, reference numeral 102 may reference element "02" in FIG. 1, and a similar element may be referenced as 402 in FIG. 4.

FIG. 1 illustrates a view of a cross-section of an example of a semiconductor device 100 suitable for a semiconductor device with an indentation in accordance with a number of embodiments of the disclosure. The semiconductor device 100 can be a semiconductor wafer (wafer) or a semiconductor chip (chip).

Figure 4A:
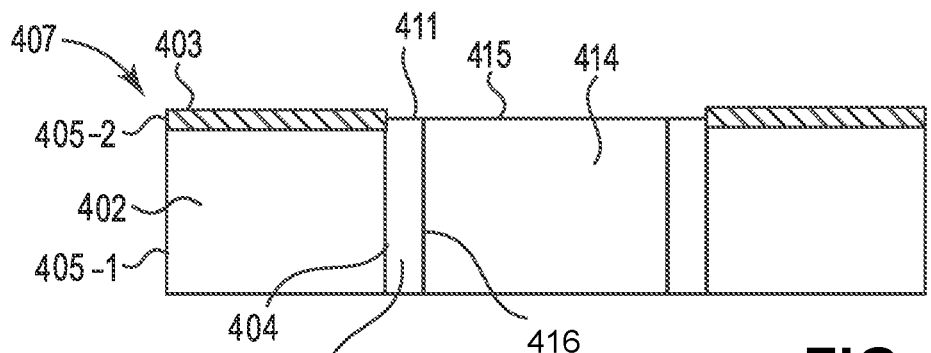
FIG. 4A illustrates a view of an example cross-section of a portion of an example semiconductor device at a particular stage in an example fabrication sequence in accordance with a number of embodiments of the disclosure.
Figure 4B:
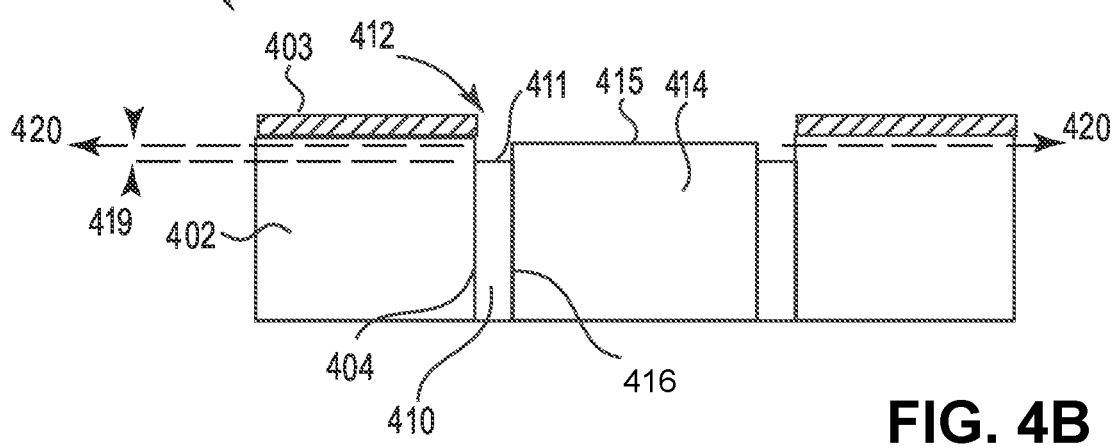
FIG. 4B illustrates a view of an example cross-section of a portion of an example semiconductor device at a particular stage in an example fabrication sequence in accordance with a number of embodiments of the disclosure.
Figure 4C:
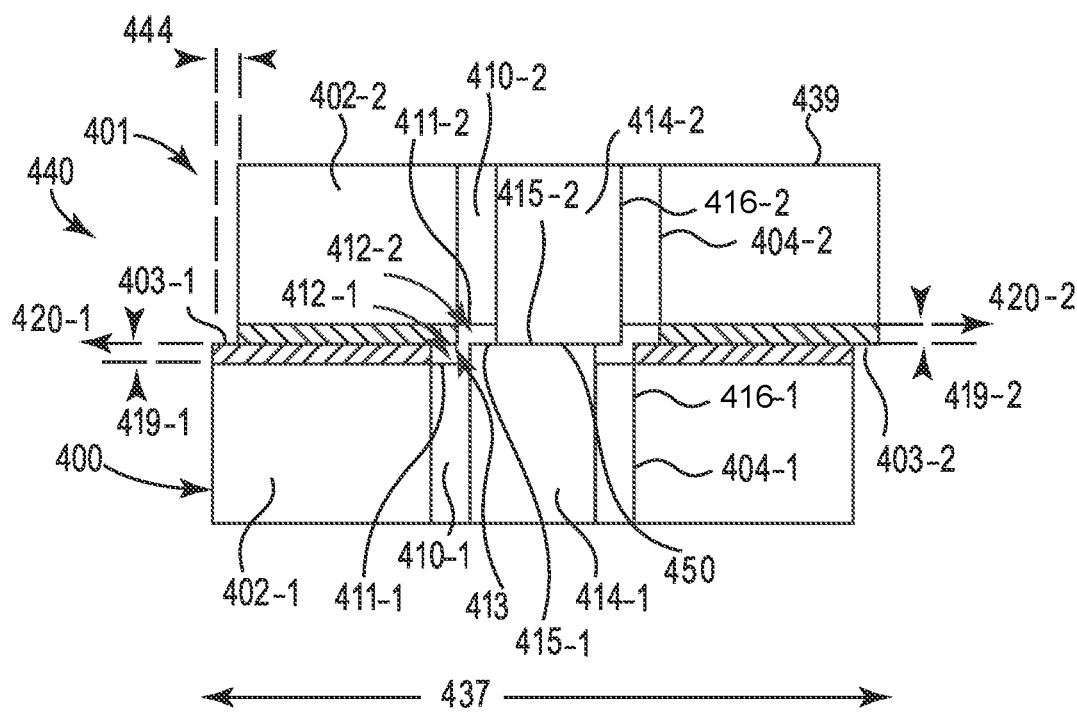
FIG. 4C illustrates a view of an example cross-section of an apparatus including an alignment moat in accordance with a number of embodiments of the disclosure.

The semiconductor device 100 can be bonded to another semiconductor device (e.g., semiconductor device 401 as illustrated in FIG. 4C). For instance, a plurality of semiconductor devices can be bonded together to form various types of memory (e.g., DRAM), storage (e.g., NAND), and/or hybrid memory (e.g., a combination of DRAM and logic) and/or various types of integrated circuits such as CMOS integrated circuits.

In some embodiments, a first semiconductor device (e.g., a front-end wafer including active transistors) can be bonded to a second semiconductor device (e.g., a back-end wafer which has few or an absence of any active transistors). In such embodiments, the first semiconductor device and the second semiconductor device can be processed in parallel, saving cycle time. The semiconductor devices can be bonded to form a system including the semiconductor devices. As mentioned, the system including the semiconductor devices can be employed in various types of memory.

Various types of bonding can be employed to bond the semiconductor devices together. The bonding can include a heat treatment. In some embodiments, the semiconductor devices can be fusion bonded together. In another embodiment, the semiconductor devices can be hybrid bonded together. For instance, the semiconductor devices can be hybrid bonded together by way of heat treatment of the semiconductor devices. In another embodiment, a portion of the back-end substrate is removed by grinding, chemical-mechanical-processing (CMP) or etch processes, leaving the metal layers bonded to the front-end substrate.

As illustrated in FIG. 1, the semiconductor device 100 can include a dielectric material 102, a conductive material 114, and a spacer 110. As used herein, the term "dielectric material" refers to and includes electrically insulative materials. Dielectric material, as discussed herein, may include, but is not limited to, one or more of an insulative oxide material or an insulative nitride material. A dielectric oxide may be an oxide material, a metal oxide material, or a combination thereof. The dielectric material may include, but is not limited to, a silicon oxide ($SiO_x$), doped $SiO_x$, phosphosilicate glass, borosilicate glass, borophosphosilicate glass, fluorosilicate glass, tetraethylorthosilicate (TEOS), aluminum oxide ($AlO_x$), silica carbon nitride (SiCN), silicon oxynitride (SiON), gadolinium oxide (GdOx), hafnium oxide (HfOx), magnesium oxide (MgOx), niobium oxide (NbOx), tantalum oxide (TaOx), titanium oxide (TiOx), zirconium oxide carboxynitride material (e.g., SiOxCzNy), a combination thereof or a combination of one or more of the listed materials with silicon oxide. One or more embodiments provide that the dielectric material comprises a vertical stack formed of a plurality of stacked layers of different dielectric materials such as layers of different oxide materials.

As used herein, the term "conductive material" refers to and includes electrically conductive materials. Embodiments provide that the conductive material can be a metal. The conductive material can include a metal (e.g., tungsten (W), copper (Cu), aluminum (Al), titanium (Ti), tantalum (Ta), ruthenium (Ru), cobalt (Co), molybdenum (Mo), etc.), a conductive metal nitride (e.g., titanium nitride, tantalum nitride, etc.), and/or a metal-semiconductor compound (e.g., tungsten silicide, cobalt silicide, titanium silicide, etc.), among other materials. One or more embodiments provide that the conductive material comprises copper.

As used herein, the term "spacer" refers to and includes electrically insulative materials. The spacer 110 can be a dielectric material that is the same or different than a dielectric material included in the dielectric material 102.

One or more embodiments provide that the spacer 110 comprises a tantalum oxide (TaOx), such as lithium tantalate.

The dielectric material 102 can include a plurality of surfaces such as a top surface 103 and a side surface 104. The top surface 103 can be a top surface and the side surface 104 can be a side surface. The top surface 103 can be perpendicular to the side surface 104, as illustrated in FIG. 1. The side surface 104 can be a side surface of the dielectric material 102 that is most proximate to the spacer 110 and the conductive material 114, as illustrated in FIG. 1. The side surface 104 can be a rounded surface, such as an elliptical surface or circular surface.

The conductive material 114 can include a plurality of surfaces such as a top surface 115 and a side surface 116. The top surface 115 can be a top surface and the side surface 116 can be a side surface. The top surface 115 can be perpendicular to the side surface 116, as illustrated in FIG. 1. The side surface 116 can be a side surface of the conductive material 114 that is most proximate to the spacer 110 and the dielectric material 102, as illustrated in FIG. 1.

Figure 4D:
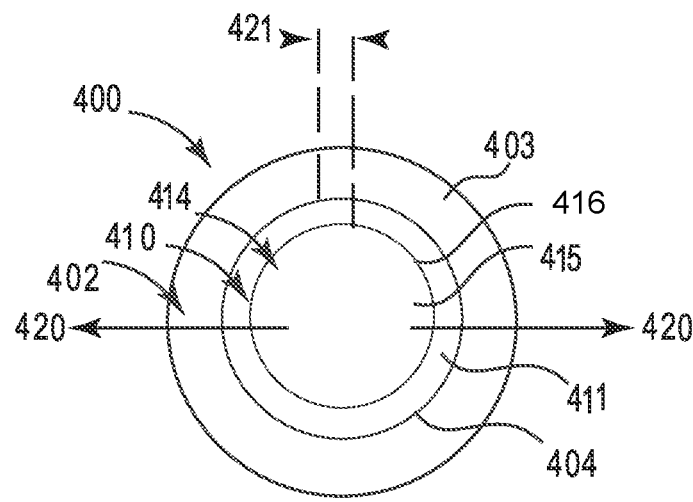
FIG. 4D illustrates a top-down view of the example semiconductor device with an indentation in accordance with a number of embodiments of the disclosure.

In some embodiments, the conductive material 114 can be substantially circular or substantially elliptical. For instance, when viewed from a top down view (e.g., as illustrated in FIG. 4D) the perimeter of the conductive material 114 can be substantially circular or substantially elliptical (e.g., the conductive material 114 may be a cylinder or an ellipsoid). In such embodiments, the side surface 116 can be a rounded surface, such as an elliptical surface or circular surface. The side surface 116 can have a substantially similar shape as a shape of the side surface 104 of the dielectric material 102. For instance, the side surface 116 can have a rounded shape and the side surface 104 of the dielectric material 102 can have a rounded shape in the form of a closed loop, such as a closed circle or closed ellipse. The conductive material 114 can form a closed circle with a smaller diameter than a diameter of a closed circle formed by the side surface 104 of the dielectric material 102.

In some embodiments, an indentation 112 can extend continuously along an entire circumference of the conductive material 114. The presence of the indentation 112 can permit subsequent formation of an apparatus having an alignment moat. As detailed herein, the alignment moat that can extend continuously along the entire circumference of the conductive material 114 can prevent or mitigate contact between the conductive material 114 and a different type of material (e.g., a dielectric material) and thereby promote formation of complete bonds (e.g., the absence of voids at an interface between a first conductive material that is bonded to a second conductive material).

As illustrated in FIG. 1, the spacer 110 can be located between the side surface 104 of the dielectric material 102 and the side surface 116 of the conductive material 114. For instance, the spacer 110 can be in physical contact with a portion of the side surface 104 of the dielectric material 102 and also can be in physical contact with a portion of the side surface 116 of the conductive material 114.

In some embodiments, a top surface 111 of the spacer 110 can have a width 121 that is uniform along the entire circumference of the conductive material 114. Stated differently, the side surface 116 can be equidistant from the side surface 104 at any point along the side surface 116. A uniform width of the spacer 110 can promote uniform electrical properties of the semiconductor device 100. However, in some embodiments, the width 121 can vary along the circumference of the conductive material.

As mentioned, the top surface 111 of the spacer 110 can be recessed a distance 119 below a plane 120 extending along the top surface 115 of the conductive material 114 to define the indentation 112. In some embodiments, the distance 119 can be a uniform distance below the plane 120 along the entire circumference of the conductive material 114. Having the top surface 111 be a uniform distance below the plane along the entire circumference of the conductive material can promote uniform electrical properties of the semiconductor device 100. However, in some embodiments, the distance 119 can vary along the circumference of the conductive material.

Figure 2:
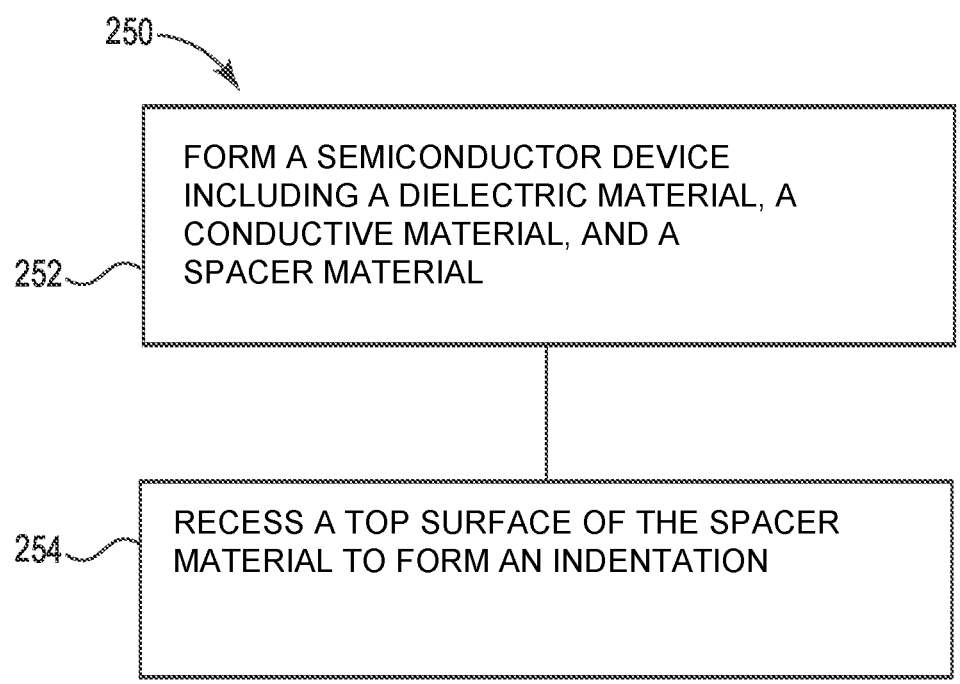
FIG. 2 illustrates a flow diagram for an example of a method of formation of a semiconductor device suitable for a semiconductor apparatus with an alignment moat in accordance with a number of embodiments of the disclosure.
Figure 3:
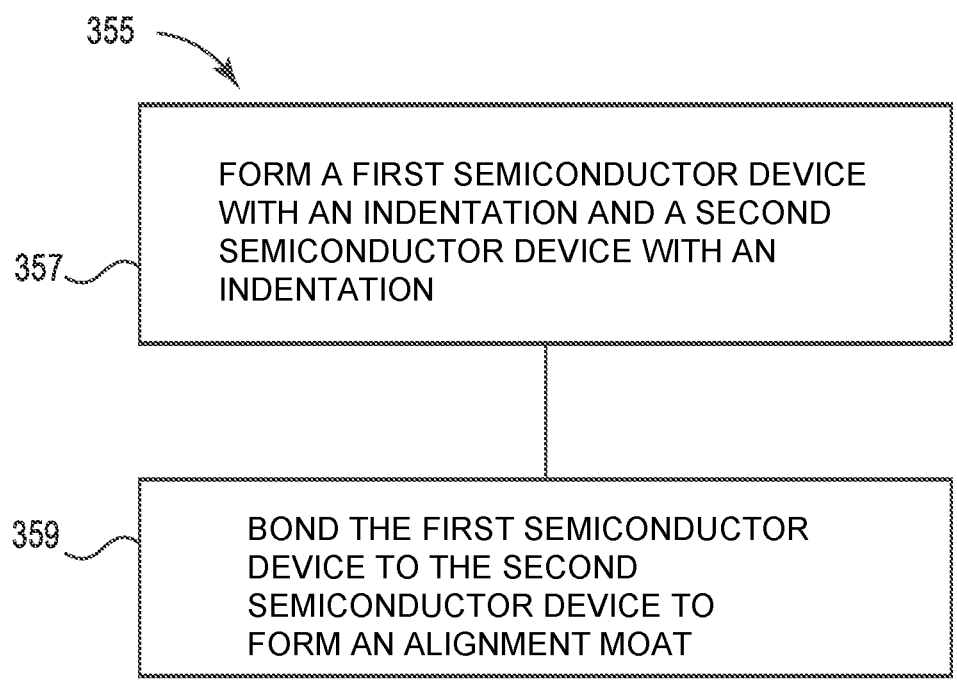
FIG. 3 illustrates a flow diagram for an example of a method of formation of a system including an apparatus with an alignment moat in accordance with a number of embodiments of the disclosure.

FIG. 2 illustrates a flow diagram for an example of a method 250 of formation of a semiconductor device suitable for a semiconductor apparatus with an alignment moat in accordance with a number of embodiments of the disclosure. FIG. 3 illustrates a flow diagram for an example of a method 355 of formation of a system including an apparatus with an alignment moat in accordance with a number of embodiments of the disclosure. Although the methods 250, 355 are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 252, a semiconductor device can be formed. For instance, a semiconductor substrate including a dielectric material, a conductive material, and a spacer located between the dielectric material and the conductive material can be formed.

In some embodiments, the semiconductor device can be formed by forming an opening in a stack of dielectric materials that are disposed on a substrate, as detailed herein. A spacer can be deposited in the opening, as detailed herein. For instance, the spacer can be conformally deposited in the opening. An etch can be performed to remove a portion of the spacer and thereby form a conductive material deposition space. A conductive material can be deposited in the conductive material deposition space. The conductive material can be planarized to form the semiconductor device (e.g., semiconductor device 407, as illustrated in FIG. 4A). For instance, chemical-mechanical planarization can be performed to remove a portion of the conductive material and thereby form the semiconductor device.

Notably, at this stage the semiconductor device does not include an indentation. For instance, a top surface of the spacer can be coplanar with a top surface of the conductive material, a top surface of the dielectric material, or both. As a result of the top surface of the spacer being coplanar with the top surface of the conductive material, the top surface of the dielectric material, or both, the semiconductor device can be prone of formation of improper bonds when undergoing bonding (e.g., annealing) with another semiconductor substate.

At 254, a top surface of the spacer can be etched to form an indentation. That is, the etch can be performed to recess the top surface of the spacer a distance below a plane extending along the top surface of the conductive material to form an indentation. As mentioned, the indentation can be formed between the dielectric material and the conductive material. For instance, the indentation can be formed between the side surface of the dielectric material and the side surface of the conductive material.

Various etching and masking processes may be utilized. Etching is a process to remove (e.g., chemically) different materials selectively and/or non-selectively from among different portions of semiconductor devices during the fabrication process. Two types of etchants are liquid-phase (wet) and plasma-phase (dry).

In some examples, a wet etch can be performed to form the indentation. Wet etching uses liquid etchants. During a wet etch, a semiconductor device can be immersed in a bath of the etchant, which can be agitated to achieve good process control. As an example, buffered hydrofluoric acid (BHF) can be used to etch silicon dioxide. As an alternative to immersion, certain semiconductor device fabrication tools and equipment (e.g., a semiconductor device processing chamber) may employ a gas to cushion and protect one side of the wafer while an etchant is applied to the other side.

In some examples, a plasma or dry etch can be performed to form the indentation. Plasma etching tools and equipment can operate in several modes by adjusting parameters of a plasma applied to a semiconductor device undergoing a fabrication process. The plasma can produce energetic free radicals, neutrally charged, that react at a surface of the semiconductor device. A source gas for the plasma can contain small molecules rich in chlorine or fluorine, for instance.

As mentioned, FIG. 3 illustrates a flow diagram for an example of a method 355 of formation of a system including an alignment moat. At 357, a first semiconductor device (e.g., semiconductor device 400 as illustrated in FIG. 4C) with an indentation and a second semiconductor device (e.g., semiconductor device 401, as illustrated in FIG. 4C) with an indentation can be formed, as detailed herein. The first semiconductor device can include the same or different materials and/or components as the second semiconductor device.

At 359, the first semiconductor device can be bonded to the second semiconductor device to form an alignment moat (e.g., alignment moat 413, as detailed herein) therebetween. For instance, hybrid bonding can be employed to bond the first semiconductor device to the second semiconductor device, among other possibilities. In some embodiments, bonding the first semiconductor device to the second semiconductor device to form an apparatus including an alignment moat can occur by placing the first semiconductor device in physical contact with the second semiconductor device and elevating a temperature to a thermal annealing temperature to form hybrid bonds the first semiconductor device and the second semiconductor device.

FIG. 4A illustrates a view of an example cross-section of a portion of an example semiconductor device at a particular stage in an example fabrication sequence in accordance with a number of embodiments of the disclosure. The semiconductor device 407 illustrated in FIG. 4A can be similar to the semiconductor device 100 in FIG. 1 but the semiconductor device 407 does not include an indentation. For instance, the semiconductor device 407 includes a dielectric material 402 with a top surface 403 and a side surface 404, a conductive material 414 having a top surface 415 and side surface 416, and a spacer 410 located between the second (e.g., side) surface 404 of the dielectric material 402 and the side surface 416 of the conductive material 414. A portion of the spacer 410 will be removed to form a spacer that is recessed a distance below a top surface of a conductive material, as detailed herein. The dielectric material 402 can formed of layer of dielectric material such as a first layer of dielectric material 405-1 and a second layer of dielectric material 405-2, among other possible quantities of layers of dielectric materials.

The semiconductor device 407 illustrated in FIG. 4A is shown at a point in time that corresponds to various processing activities already having been performed in the example semiconductor device fabrication sequence. For instance, in some embodiments the semiconductor device 407 can be formed on a substrate (not shown). The substrate may be formed from various undoped or doped materials on which various other materials may be deposited, masked, etched, etc., to form semiconductor devices thereon. Examples of a relatively inert undoped substrate material may include monocrystalline silicon, polycrystalline silicon (polysilicon), and amorphous silicon, among other possibilities.

In some embodiments, a dielectric material 402 can be deposited on a substrate. The dielectric material 402 can be formed of a plurality of interactive layers which are subsequently deposited on and over the substrate, in some examples.

As mentioned, an opening can be formed in the dielectric material 402 and a spacer 410 can be deposited in the opening. As detailed herein, the spacer 410 can be conformally deposited on and therefore can be initially in physical contact with the entire side surface 404 of the dielectric material 402.

An etch can be performed to a remove a portion of the spacer and thereby form a conductive material deposition space. A conductive material can be deposited in the conductive material deposition space and can be subsequently planarized to form the semiconductor device (e.g., a semiconductor device 407, as illustrated in FIG. 4A). For instance, the conductive material 414 can be conformally deposited in the conductive material deposition space that is defined at least in part by the spacer 410 such that the side surface 416 of the conductive material is in physical contact with the spacer 410.

However, due to the absence of an indentation, a top surface 411 of a spacer 410 can be coplanar with a top surface 415 of a conductive material 414, as illustrated in FIG. 4A. That absence of the indentation prohibits formation of an alignment moat and thus renders the semiconductor device in FIG. 4A prone of formation of improper bonds when undergoing bonding (e.g., annealing) with another semiconductor device.

Accordingly, as shown in FIG. 4B, the top surface 411 has been recessed a distance 419 below a plane 420 extending along the top surface 415 of the conductive material 414 to define an indentation 412. That is, FIG. 4B illustrates a view of an example cross-section of a portion of an example semiconductor device at a particular stage in an example fabrication sequence in accordance with a number of embodiments of the disclosure. The semiconductor device 400 in FIG. 4B can be analogous or similar to semiconductor device 100 in FIG. 1.

FIG. 4C illustrates a view of a portion of an example of system including semiconductor device 400 and semiconductor device 401 at a particular stage in an example semiconductor device fabrication sequence in accordance with a number of embodiments of the disclosure. The fabrication sequence illustrated in FIG. 4C is shown at a point in time that corresponds to various processing activities already having been performed in the fabrication sequence.

The semiconductor device 400 (e.g., a first semiconductor device) in FIG. 4C can be analogous or similar to semiconductor device 100 in FIG. 1 and/or semiconductor device 400 in FIG. 4B. For instance, the semiconductor device 400 can include a first dielectric material 402-1 with a first top surface 403-1 and a side surface 404-1. The semiconductor device 400 can include a first conductive material 414-1 (e.g., first portion of conductive material) disposed in the first dielectric material 402-1, the first conductive material 414-1 having a top surface 415-1 and a side surface 416-1. The semiconductor device 400 can include a first spacer 410-1 located between and in physical contact with the side surface 404 of the first dielectric material 402-1 and side surface 416-1 of the first conductive material 414-1. The semiconductor device 400 can be configured such that the first spacer 410-1 has a top surface 411-1 that is recessed a first distance 419-1 below a plane 420-1 extending along the top surface of the dielectric material.

FIG. 4D illustrates a top-down view of the example semiconductor device 400 (e.g., semiconductor device 400 as illustrated in FIG. 4B) with an indentation in accordance with a number of embodiments of the disclosure. As illustrated in FIG. 4D, the dielectric material 402 with the top surface 403 and the side surface 404 can surround the spacer 410. Similarly, the spacer 410 can surround the conductive material 414. As illustrated in FIG. 4D, the top surface 411 of the spacer can have a uniform width 421 around a circumference of the conductive material 414.

In some embodiments, the conductive material 414 can be divided into a first portion (e.g., 414-1) and a second portion (e.g., 414-2) which include respective top surfaces (e.g., 415-1-1 and 415-2) that are bonded or otherwise connected to each other. The spacer (e.g., spacer) can include a first spacer (e.g., 410-1) surrounding the first portion of the conductive material, and a second spacer (e.g., 410-2) surrounding the second portion of the conductive material, where the top surface of the first spacer and the top surface of the second spacer are indented (e.g., a distance 419-1 and 419-2) from the top surface of the first portion and the top surface of the second portion, respectively, to define an alignment moat 413.

The semiconductor device 401 (e.g., the second semiconductor device) in FIG. 4C can be analogous or similar to semiconductor device 400 in FIG. 4B. That is, while illustrated as being inverted (relative to the semiconductor device 400 in FIG. 4B) the semiconductor device 401 can be analogous or similar to semiconductor device 400 in FIG. 4B. For instance, the semiconductor device 401 can include a second dielectric material 402-2 with a top surface 403-2 and a side surface 404-2. The semiconductor device 401 can include a second conductive material 414-2 (e.g., a second portion of a conductive material) disposed in the second dielectric material 402-2, the second conductive material 414-2 having a top surface 415-2 and a side surface 416-2. The semiconductor device 401 can include a second spacer 410-2 located between and in physical contact with the side surface 404-2 of the second dielectric material 402-2 and side surface 416-2 of the second conductive material 414-2. The semiconductor device 401 can be configured such that the second spacer 410-2 has a top surface 411-2 that is recessed a second distance 419-2 below a plane 420-2 extending along the top surface of the dielectric material. The semiconductor device 401 in FIG. 4C can include the same or different dielectric material as the semiconductor device 400 in FIG. 4B. As illustrated in FIG. 4C, an alignment moat is defined between the top surface 411-1 of the first spacer 410-1 and the top surface 411-2 of the second spacer 410-2.

In some embodiments, the first distance 419-1 can be substantially equal to the second distance 419-2. As used herein, the first distance 419-1 being substantially equal to the second distance 419-2 refers to the first distance 419-1 being less than or equal to 1 percent, 2 percent, 5 percent, or 10 percent of the second distance 419-2. Having the first distance 419-1 be substantially equal to the second distance 419-2 can promote formation of complete bonds. For instance, in some embodiments, the first distance 419-1 can be equal to (the same as) the second distance 419-2. The first distance 419-1 and the second distance 419-2 can be a distance in a range from 1 micron to 30 microns, among other possibilities.

In some embodiments, a volume of the first indentation 412-1 and a volume of the second indentation 412-2 are substantially equal. As used herein, the volume of the first indentation 412-1 being substantially equal to the volume of the second indentation 412-2 refers to the volume of the first indentation being less than or equal to within 1 percent, 2 percent, 5 percent, or 10 percent of the volume of the second indentation 412-2.

For instance, in some embodiments, a shape and/or a size of the first indentation 412-1 and a shape and/or a size of the second indentation 412-2 can be substantially equal. For example, a shape of the first indentation 412-1 and a shape of the second indentation can be the same size and shape. Having the volume of the first indentation 412-1 and the volume of the second indentation 412-2 be substantially equal (e.g., having the same size and shape) can promote formation of an alignment moot that yields complete bonds.

As illustrated in FIG. 4C, a top surface 403-1 of the first dielectric material is parallel to and in contact with a top surface 403-2 of the second dielectric material. Thus, a surface such as the top surface of the first conductive material can be bonded to a surface such as the top surface of the second conductive material to form a bond 450 and the top surface 403-1 of the first dielectric material is bonded to the top surface 403-2 of the second dielectric material to form a hybrid bond between the first semiconductor device 400 and the semiconductor device 401. Embodiments provide that the bond 450 can be a complete bond, as discussed herein.

A volume of an alignment moat 413 can be equal to a sum of the volume of the first indention 412-1 and a volume of the second indentation 412-2. In some embodiments, the alignment moat 413 can be fluid filled. For instance, in some embodiments both the first indentation 412-1 and the second indentation 412-2 can be fluid filled and thus the resultant alignment moat 413 can be fluid-filled. For instance, the first indentation 412-1 and the second indentation 412-2 can include air. As illustrated in FIG. 4C, the first indentation is in fluidic communication with the second indentation. However, embodiments are not so limited. For instance, the first indentation, and the second indentation, can be vacuums and/or include a different fluid (e.g., nitrogen) than air.

In some embodiments, the semiconductor device 400 and semiconductor device 401 can be chips or wafers. In some embodiments, the semiconductor device 400 is a chip and the semiconductor device 401 is a chip. In some embodiments, the semiconductor device 400 is a wafer and the semiconductor device 401 is a wafer. In some embodiments, the semiconductor device 400 or the semiconductor device 401 is a wafer and the other of the semiconductor device 400 or the semiconductor device 401 is a chip.

Figure 4E:
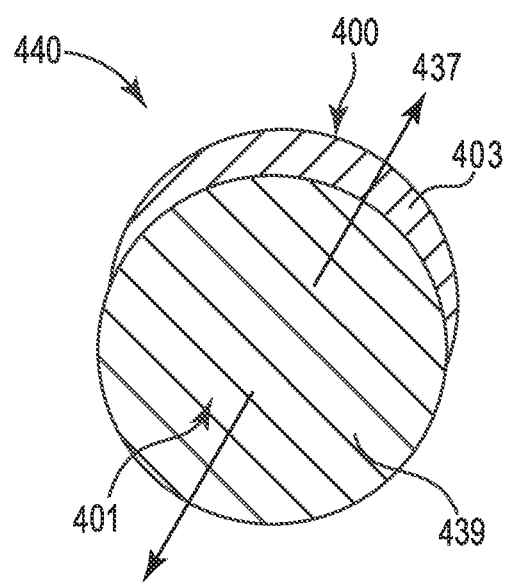
FIG. 4E illustrates a top-down view of the example system including an apparatus with an alignment moat in accordance with a number of embodiments of the disclosure.

Notably, despite that first semiconductor device 400 and the second semiconductor device 401 being misaligned by a distance 444 in a direction 437 a bond 450 that is complete can be realized due to the presence of the alignment moat 413. For instance, FIG. 4E illustrates a top-down view of the example of a portion of an apparatus 440 including an alignment moat (which is not visible from the vantage of FIG. 4E) in accordance with a number of embodiment of the disclosure. That is, if properly aligned (e.g., in the direction 437) the top surface 403-1 the first semiconductor 400 would not be visible and instead would entirely be overlaid by second semiconductor substrate such that only the surface 439 would be visible from the vantage of FIG. 4E. Yet, despite the misalignment the first semiconductor device 400 and the second semiconductor device 401, as illustrated in FIG. 4C and FIG. 4E, a complete bond can still be realized between the first semiconductor device 400 and the second semiconductor device 401 due to the presence of the alignment moat.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the disclosure includes other applications in which the above structures and methods are used. Therefore, the scope of a number of embodiments of the disclosure should be determined with reference to the appended claims, along with the full range of equivalents to which such claims are entitled.

While examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to stacking a semiconductor device have been illustrated and described herein, examples of the disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to stacking a semiconductor device than those disclosed herein are expressly included within the scope of this disclosure.

What is claimed is:

1. An apparatus, comprising:
    a conductive material divided into first and second portions which include top surfaces connected to each other, respectively;
    a first spacer surrounding the first portion of the conductive material; and
    a second spacer surrounding the second portion of the conductive material;
    wherein a top surface of the first spacer and a top surface of the second spacer are indented from a top surface of the first portion and a top surface of the second portion, respectively, to define an alignment moat, where the alignment moat is fluid filled.

2. The apparatus of claim 1, wherein the conductive material is substantially circular or substantially elliptical.

3. The apparatus of claim 2, wherein the alignment moat extends continuously along an entire circumference of the conductive material.

4. The apparatus of claim 3, wherein the top surface of the first spacer has a uniform width along the entire circumference of the conductive material, wherein the top surface of the second spacer has a uniform width along the entire circumference of the conductive material, or both.

5. The apparatus of claim 1, further comprising a dielectric material surrounding the first spacer and the second spacer, wherein the dielectric material is an oxide material.

6. The apparatus of claim 1, wherein the conductive material includes copper, aluminum, tungsten, or a combination thereof.

7. The apparatus of claim 1, wherein the first spacer and the second spacer comprise an oxide material.

8. A system, comprising:
    a first semiconductor device including:
        a first dielectric material with a top surface and a side surface;
        a first conductive material disposed in the first dielectric material, the first conductive material having a top surface and a side surface; and
        a first spacer located between and in physical contact with the side surface of the first dielectric material and the side surface of the first conductive material, the first spacer having a top surface that is recessed a first distance below a first plane extending along the top surface of the first dielectric material to form a first indentation; and
    a second semiconductor device bonded to the first semiconductor device, the second semiconductor device including:
        a second dielectric material having a top surface and a side surface;
        a second conductive material disposed in the second dielectric material, the second conductive material having a top surface and a side surface; and
        a second spacer located between and in physical contact with the side surface of the second dielectric material and the side surface of the second conductive material, the second spacer having a top surface that is recessed a second distance below a second plane extending along the top surface of the second dielectric material to form a second indentation, wherein an alignment moat is present between the top surface of the first spacer and the top surface of the second spacer, and wherein the alignment moat is fluid filled.

9. The system of claim 8, wherein the first distance below the first plane and the second distance below the second plane are substantially equal.

10. The system of claim 8, a volume of the first indentation and a volume of the second indentation are substantially equal.

11. The system of claim 8, wherein a shape of the first indentation and a shape of the second indentation are substantially equal.

12. The system of claim 8, wherein the top surface of the first dielectric material is parallel to and in contact with the top surface of the second dielectric material.

13. The system of claim 8, wherein the top surface of the first conductive material is bonded to the top surface of the second conductive material, and wherein the top surface of the first dielectric material is bonded to the top surface of the second dielectric material.

14. The system of claim 8, wherein the first indentation is in fluidic communication with the second indentation to form the alignment moat.

15. The system of claim 14, wherein the alignment moat is air-filled.

16. A method of forming an apparatus with an indentation, the method comprising:
  forming a first semiconductor device including:
    a first dielectric material having a top surface and a side surface;
    a first conductive material having a top surface and a side surface; and
    a first spacer located between the dielectric material and the conductive material,
    wherein the top surface of the first spacer is coplanar with the top surface of the first conductive material; and
  performing a wet etch to recess the top surface of the first spacer a distance below a first plane extending along the top surface of the first dielectric material to form an indentation between the first dielectric material and the first conductive material;
  forming a second semiconductor device including:
    a second dielectric material having a top surface and a side surface;
    a second conductive material having a top surface and a side surface; and
    a second spacer located between the second dielectric material and the second conductive material; and
  recessing a top surface of the second spacer a distance below a second plane extending along the top surface of the second conductive material to form an indentation between second dielectric material and the second conductive material; and
  bonding the first semiconductor device to the second semiconductor device to form an apparatus including an alignment moat by:
    placing the first semiconductor device in physical contact with the second semiconductor device; and
    elevating a temperature to a thermal annealing temperature to form hybrid bonds between the first semiconductor device and the second semiconductor device,
  wherein the alignment moat is fluid filled.

17. The method of claim 16, further comprising forming the first spacer by:
  forming an opening in the first semiconductor device;
  conformally depositing the first spacer on the first semiconductor device;
  performing an etch to remove a portion of the first spacer and thereby form a conductive material deposition space;
  depositing the first conductive material in the conductive material deposition space; and
  performing chemical-mechanical planarization to remove a portion of the first conductive material.

* * * * *